United States Patent
Kinoshita et al.

(10) Patent No.: US 6,639,858 B2
(45) Date of Patent: Oct. 28, 2003

(54) SEMICONDUCTOR MEMORY DEVICE HAVING DEFECTIVE MEMORY BLOCK

(75) Inventors: Hiromu Kinoshita, Tokyo (JP); Hideo Matsui, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/162,633

(22) Filed: Jun. 6, 2002

(65) Prior Publication Data

US 2003/0007399 A1 Jan. 9, 2003

(30) Foreign Application Priority Data

Jul. 9, 2001 (JP) .......................................... 2001-208293

(51) Int. Cl.[7] .................................................. G11C 7/00
(52) U.S. Cl. ............. 365/200; 365/230.03; 365/230.06; 365/225.7
(58) Field of Search ........................... 365/200, 230.03, 365/230.06, 225.7, 201, 230.08

(56) References Cited

U.S. PATENT DOCUMENTS 5,701,270 A * 12/1997 Mohan Rao ............ 365/230.03
6,016,560 A    1/2000 Wada et al.

FOREIGN PATENT DOCUMENTS

JP          10-233098       9/1998
WO          WO97/00518      1/1997

* cited by examiner

*Primary Examiner*—David Lam
(74) *Attorney, Agent, or Firm*—Burns, Doane, Swecker & Mathis, LLP

(57) ABSTRACT

A semiconductor memory such as 256 KB-memory has a memory cell array divided into a plurality of memory blocks, and a defective memory block exists in the memory cell array. In this case, to relive the 256 KB-memory as a 192 KB-memory not including the defective memory block of 64 KB, identification information identifying the defective memory block is stored in a relief condition storing unit, an address sent from an address bus is changed according to the identification information, and a changed address is input to a decoder of the memory cell array. For example, because a memory block of an address (0, 0) is not guaranteed, in cases where a physical address (0, 1) is assigned to the defective memory block, the address change is performed to change an address (0, 0) sent from the address bus to the address (0, 1) of the defective memory block.

11 Claims, 13 Drawing Sheets

FIG.9
FUSE IS ARRANGED FOR EACH BLOCK
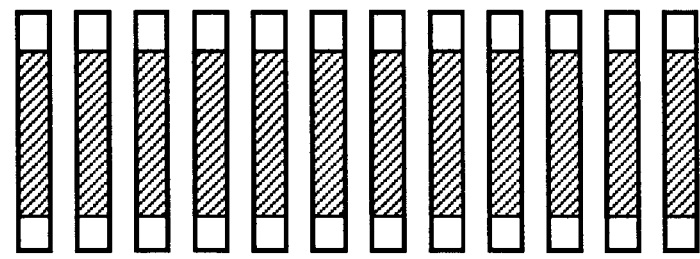
FUSE CORRESPONDING TO DEFECTIVE BLOCK IS CUT
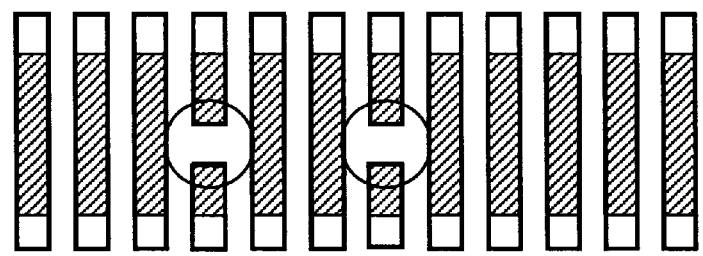
FIG.10
INFORMATION OF DEFECTIVE BLOCK
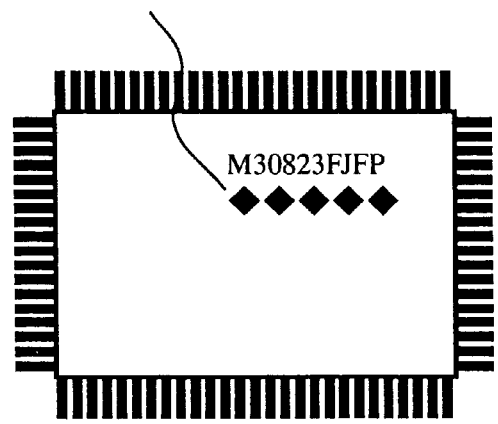

FIG.11
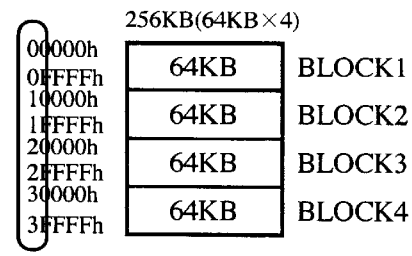
| | BLOCK1 | BLOCK2 | BLOCK3 | BLOCK4 |
|---|---|---|---|---|
| AD16 | 0 | 1 | 0 | 1 |
| AD17 | 0 | 0 | 1 | 1 |
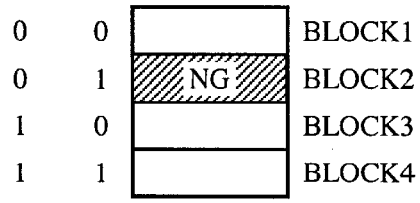
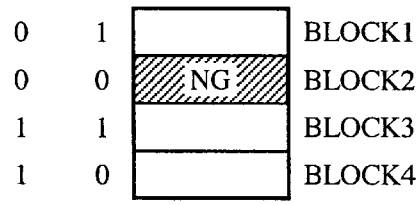
REARRANGEMENT IN ADDRESS INCREASING ORDER
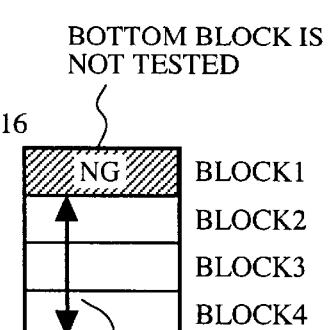
BOTTOM BLOCK IS NOT TESTED
TEST OF 192KB-ROM FOR UPPER BITS OF 192KB
INVERSION OF AD16

FIG.12

AD17 AD16
| 0 | 0 | BLOCK1 |
| 0 | 1 | BLOCK2 |
| 1 | 0 | NG | BLOCK3 |
| 1 | 1 | BLOCK4 |

↓ INVERSION OF AD17

AD17 AD16
| 1 | 0 | BLOCK1 |
| 1 | 1 | BLOCK2 |
| 0 | 0 | NG | BLOCK3 |
| 0 | 1 | BLOCK4 |

→ REARRANGEMENT IN ADDRESS INCREASING ORDER

BOTTOM BLOCK IS NOT TEST

AD17 AD16
| 0 | 0 | NG | BLOCK1 |
| 0 | 1 | BLOCK2 |
| 1 | 0 | BLOCK3 |
| 1 | 1 | BLOCK4 |

TEST OF 192KB-ROM FOR UPPER BITS OF 192KB

FIG.13

AD17 AD16
| 0 | 0 | BLOCK1 |
| 0 | 1 | BLOCK2 |
| 1 | 0 | BLOCK3 |
| 1 | 1 | NG | BLOCK4 |

↓ INVERSION OF AD16 AND AD17

AD17 AD16
| 1 | 1 | BLOCK1 |
| 1 | 0 | BLOCK2 |
| 0 | 1 | BLOCK3 |
| 0 | 0 | NG | BLOCK4 |

→ REARRANGEMENT IN ADDRESS INCREASING ORDER

BOTTOM BLOCK IS NOT TESTED

AD17 AD16
| 0 | 0 | NG | BLOCK1 |
| 0 | 1 | BLOCK2 |
| 1 | 0 | BLOCK3 |
| 1 | 1 | BLOCK4 |

TEST OF 192KB-ROM FOR UPPER BITS OF 192KB

SEMICONDUCTOR MEMORY DEVICE HAVING DEFECTIVE MEMORY BLOCK

BACKGROUND OF THE INVENTION

1. Field of the Invention

The present invention relates to a semiconductor memory of which a memory manufacturing process yield is improved.

2. Description of Related Art

In the manufacturing of a semiconductor memory such as a flash memory, defective memories are relieved to improve memory manufacturing process yields.

FIG. 18 is a view showing a conventional conception of the relief of a defective flash memory.

In a general method of relieving a defective memory, a spare bit line having a memory cell is prepared in advance in a spare area of a memory chip. When a defective memory cell occurs in a main area of the memory chip, a main bit line corresponding to the defective memory cell is replaced with the spare bit line having a memory cell.

FIG. 19 is a view showing the configuration of a conventional semiconductor memory. In FIG. 19, 1 indicates a memory cell array having a plurality of memory cells. 2 indicates a spare cell array having a memory cell. 3 indicates an X decoder for decoding lower address bits (or lower bits of an address). 4 indicates a Y decoder for decoding upper address bits (or upper bits of the address). 5 indicates a sense amplifier for reading out data of a memory cell from the memory cell array 1 or the spare cell array 2. 6 indicates a selector for outputting the data read out by the sense amplifier 5 to a data bus. 7 indicates a repair circuit.

Next, an operation of the conventional semiconductor memory will be described.

When an address of a desired memory cell is input to an address bus to read out desired data of the desired memory cell, upper bits of the address is received in the Y decoder 4 and is decoded to specify a word line corresponding to the desired memory cell of the memory cell array 1. Also, lower bits of the address is received in the X decoder 3 and is decoded to specify a bit line corresponding to the desired memory cell of the memory cell array 1. Thereafter, desired data of the desired memory cell placed at a crossing point of the word line specified by the Y decoder 4 and the bit line specified by the X decoder 3 is read out to the sense amplifier 5, and the desired data is output to the data bus through the selector 6.

The defective memory relieving method shown in FIG. 18 will be described in detail with reference to FIG. 20.

FIG. 20 is a view showing the configuration of an address replacing circuit. To simplify the description of the method, both a main area corresponding to addresses (or four memory cells) designated by 2 bits and a spare area corresponding to one bit line (or one memory cell) are prepared in advance.

A decoding circuit corresponding to the assigned addresses is connected to four main bit lines of the main area. For example, when an address AD[1:0]=10 is input to an address bus, the levels of main bit lines other than a specific main bit line corresponding to the address AD=10 are lowered to the GND level. Also, a decoding circuit having laser trimming (LT) fuses is connected to a spare bit line of the spare area. In cases where LT fuses of a spare memory cell are cut by a laser beam (or laser trimming is performed for LT fuses), one main bit line corresponding to any address is replaced with the spare bit line. In FIG. 20, because a memory cell of a main bit line corresponding to the address AD=10 is defective, LT fuses of a spare memory cell are cut, and the main bit line of the defective memory cell is replaced with the spare bit line.

FIG. 21 is an explanatory view showing a function of the selector 6 shown in FIG. 19.

As is described with reference to FIG. 20, in cases where an address is assigned to the spare bit line by cutting the LT fuses, both the spare bit line and the main bit line of the defective memory cell correspond to the same address. Therefore, one of both the spare bit line and the main bit line is selected in the selector 6. In a normal operation (or in case of no defective bit), data output from the main bit line is selected in the selector 6. However, in cases where data is output from the spare bit line (or in cases where a memory cell of a main bit line, to which an address assigned to the spare bit line is also assigned, is defective), data output from the spare bit line is selected in the selector 6.

However, because the conventional semiconductor memory has the above-described configuration, in cases where the number of main bit lines corresponding to defective memory cells exceeds the number of spare bit lines prepared in advance, it is impossible to relieve all the main bit lines corresponding to defective memory cells. Therefore, a problem has arisen that the yield for the semiconductor memory cannot be improved.

Also, there is a case where a read only memory (ROM) having a defective memory block is used as a ROM having no defective memory block. For example, even though it is impossible to relieve a semiconductor memory having a memory capacity of 256K bytes as a memory of 256K bytes (hereinafter, called 256 KB-memory), in cases where defective memory cells are concentrated at a narrow area, there is a possibility that the semiconductor memory can be relieved as a 128 KB-memory by setting a memory area of the other memory capacity of 128K bytes as a non-use memory area. However, the conventional semiconductor memory cannot be relieved as a 128 KB-memory.

SUMMARY OF THE INVENTION

An object of the present invention is to provide, with due consideration to the drawbacks of the conventional semiconductor memory, a semiconductor memory of which the yield is heightened.

The object is achieved by the provision of a semiconductor memory comprising a memory cell array having a plurality of memory blocks, identification information storing means for storing identification information which identifies a defective memory block existing in the memory blocks of the memory cell array, and address changing means for receiving an address from an address bus, changing the address to a changed address according to the identification information of the identification information storing means and outputting the changed address to a decoder of the memory cell array to specify a memory cell of the memory cell array according to the changed address.

In the above configuration, a predetermined address is changed to a physical address assigned to the defective memory block. Therefore, to relieve the semiconductor memory as a memory of a specific memory capacity lower than that of the semiconductor memory, a test suitable for the specific memory capacity can be easily performed for the memory having the blocks of the semiconductor memory other than the defective memory block of the predetermined address. Accordingly, the yield of the semiconductor memory can be improved.

It is preferred that a usable memory capacity of the memory cell array is stored in the identification information storing means.

Therefore, after a test suitable for the memory capacity of the semiconductor memory, a test suitable for the usable memory capacity determined to relive the semiconductor memory can be easily performed.

It is also preferred that the identification information storing means is arranged in an area of a programmable read-only memory.

Therefore, the yield of the semiconductor memory can be improved without influencing on a memory area used by a user.

It is also preferred that the identification information storing means is arranged in an area of a user read-only memory.

Therefore, the identification information can be easily stored in the identification information storing means.

It is also preferred that the identification information storing means is arranged in an area of a boot read-only memory.

Therefore, the identification information can be easily stored in the identification information storing means without influencing on a memory area used by a user.

It is also preferred that the identification information storing means has a fuse corresponding to each of the memory blocks of the memory cell array, and the fuse corresponding to the defective memory block is cut.

Therefore, the configuration of the identification information storing means can be simplified.

It is also preferred that the identification information stored in the identification information storing means is written on a chip of the semiconductor memory according to laser marking.

Therefore, an operator managing a test process can easily recognize the identification information.

It is also preferred that the address changing means comprises a logic circuit for receiving both an address signal indicating a value of an address bit of the address and a control signal controlling the address change, calculating an exclusive logical sum of both the address signal and the control signal and outputting the exclusive logical sum as the value of an address bit of the changed address.

Therefore, the address can be reliably changed without complicating the configuration of the address changing means.

It is also preferred that the address changing means comprises a control signal producing circuit having a fuse for outputting the control signal, which indicates no change of the address in case of a non-cut fuse, to the logic circuit and outputting the control signal, which indicates a change of the address in case of a cut fuse, to the logic circuit.

Therefore, the address change can be reliably controlled.

It is also preferred that the address changing means comprises a software tool so as to connect a plurality of memory blocks of the memory cell array other than the defective memory block according to a software process.

Therefore, the configuration of the address changing means can be simplified.

It is also preferred that the address change is performed by the address changing means so as to change a specific address assigned to a bottom memory block to a physical address of the defective memory block identified by the identification information.

Therefore, a test suitable for a memory capacity of memory blocks other than the defective memory block can be easily performed, and the yield of the semiconductor memory can be improved.

BRIEF DESCRIPTION OF THE DRAWINGS

FIG. 9 shows an example of the configuration of the relief condition storing unit;

FIG. 10 is an explanatory view showing a mark of identification information written on a chip;

FIG. 11 is an explanatory view showing an example of an address changing process;

FIG. 12 is an explanatory view showing an example of an address changing process;

FIG. 13 is an explanatory view showing an example of an address changing process;

DETAILED DESCRIPTION OF THE PREFERRED EMBODIMENTS

Embodiments of the present invention will now be described with reference to the accompanying drawings.
Embodiment 1

Figure 1:
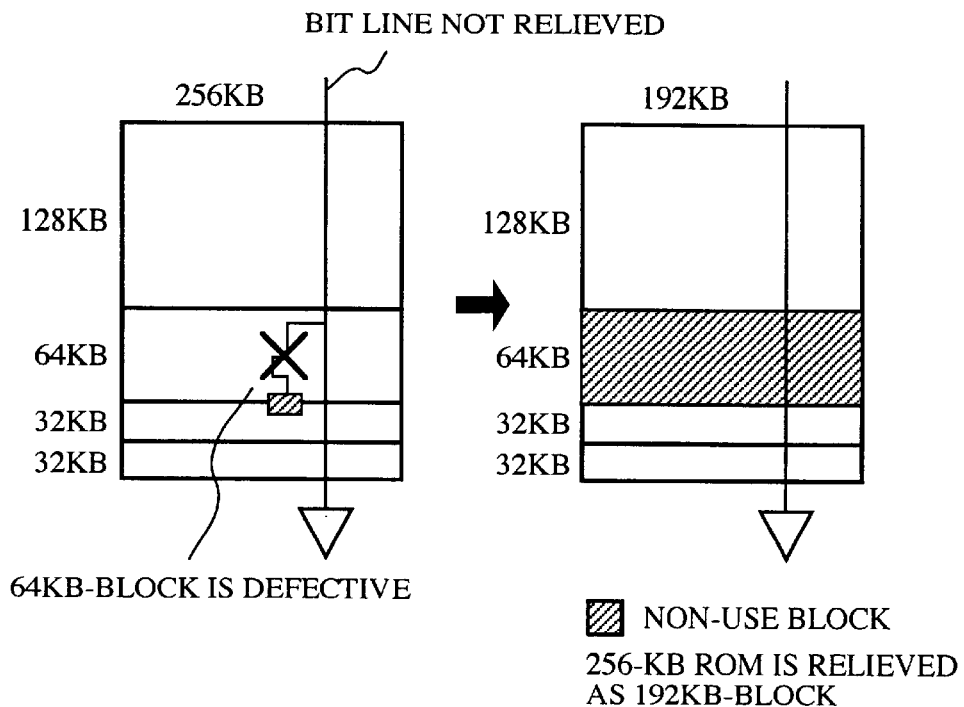
FIG. 1 is a view showing a conception of the relief of a defective bit line of a semiconductor memory according to a first embodiment of the present invention.

FIG. 1 is a view showing a conception of the relief of a defective bit line of a semiconductor memory according to a first embodiment of the present invention.

In cases where it is detected in a memory manufacturing process that the number of defective main bit lines (or the number of main bit lines corresponding to defective memory cells) exceeds the number of spare bit lines in a semiconductor memory, one or a plurality of defective main bit lines placed in a memory block cannot be replaced with one or a plurality of spare bit lines in the defective memory relieving method. Therefore, in a first embodiment, a defective memory block still including one or a plurality of defective main bit lines is set as a non-use memory block in the semiconductor memory, and the semiconductor memory is relieved by lessening a memory capacity of the semiconductor memory.

In the example shown in FIG. 1, a 256 KB-ROM represents a semiconductor memory, and one or a plurality of defective main bit lines are still placed in a 64 KB-block of the 256 KB-ROM even though the conventional memory relieving method is adopted for the 256 KB-ROM. In this case, the 256 KB-ROM cannot be used as a ROM having a memory capacity of 256K bytes. However, in cases where the 256 KB-ROM is used as a 192 KB-ROM by setting the 64 KB-block as a non-use memory block, the 256 KB-ROM is relieved because no defective main bit line exists in blocks other than the 64 KB-block.

Figure 2:
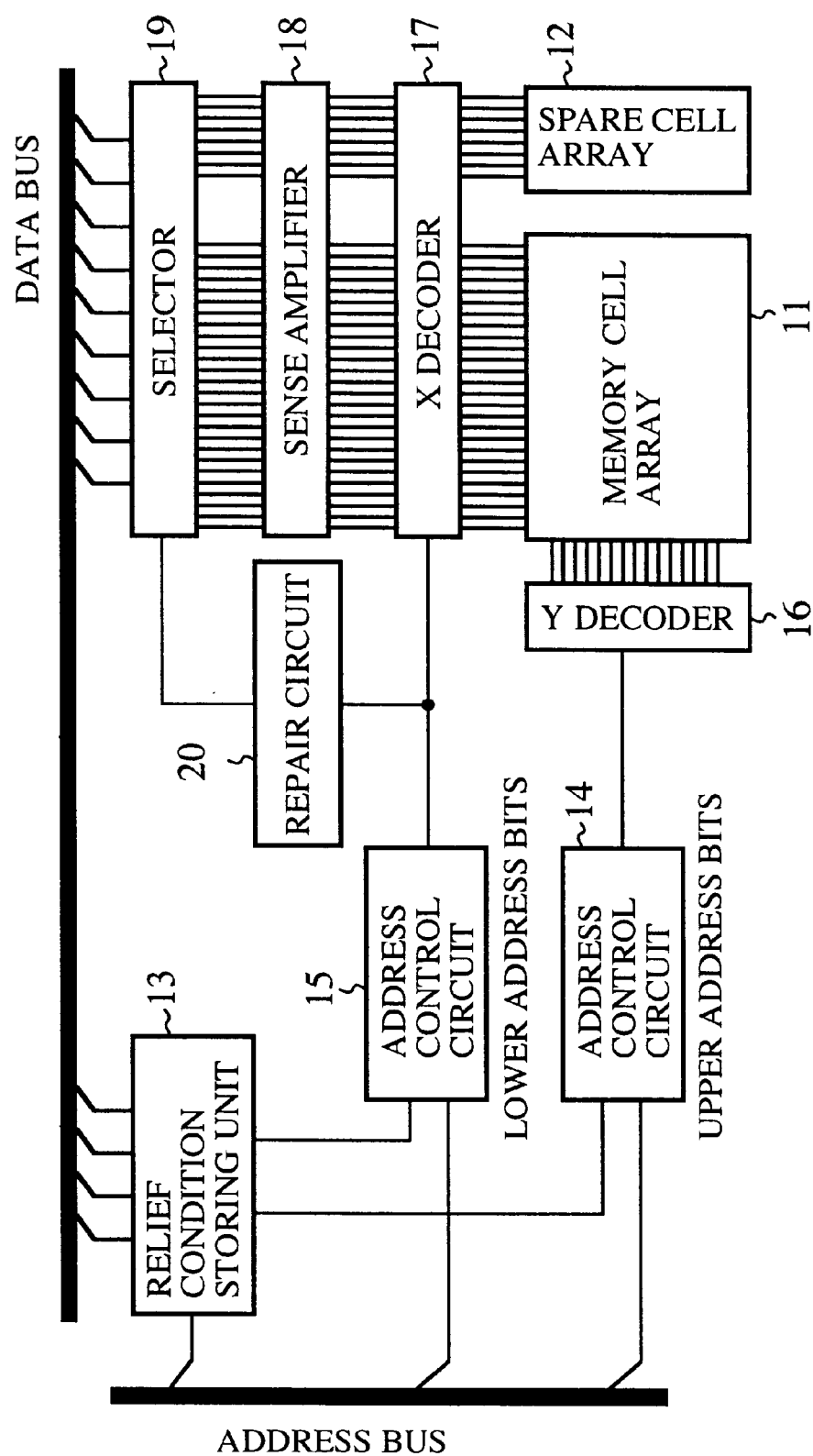
FIG. 2 is a view showing the configuration of the semiconductor memory according to the first embodiment of the present invention.

FIG. 2 is a view showing the configuration of the semiconductor memory according to the first embodiment of the present invention.

In FIG. 2, 11 indicates a memory cell array composed of a first 32 KB-block, a second 32 KB-block, a 64 KB-block and a 128 KB-block. Each memory block has a plurality of memory cells. 12 indicates a spare cell array having a plurality of spare memory cells. 13 indicates a relief condition storing unit (or an identification information storing means) in which identification information of a defective memory block (or a memory block corresponding to defective main bit lines) is stored. 14 indicates an address control circuit (or an address changing means) for changing values of upper address bits of an address sent from an address bus by referring to the identification information stored in the relief condition storing unit 13 in cases where the upper address bits are received from the address bus. 15 indicates an address control circuit for receiving lower address bits of the address from the address bus. 16 indicates a Y decoder for decoding values of the upper address bits changed in the address control circuit 14. 17 indicates an X decoder for decoding values of the lower address bits output from the address control circuit 15. 18 indicates a sense amplifier for reading out data of a memory cell, which is specified by the values of the lower address bits and the changed values of the upper address bits, from the memory cell array 11 or the spare cell array 12. 19 indicates a selector for outputting the data read out by the sense amplifier 18 to a data bus. 20 indicates a repair circuit 20.

Next, an operation of the semiconductor memory will be described below.

Identification information indicating a defective memory block, which is planned to be set as a non-use memory block, is initially stored in the relief condition storing unit 13. For example, after a semiconductor memory of 256 KB is manufactured, it is tested in a first test process whether or not the semiconductor memory has a memory capacity of 256 KB. In this test process, in cases where the semiconductor memory cannot be used as a 256 KB-memory but defective main bit lines are concentrated into the 64 KB-block of the semiconductor memory (refer to FIG. 1), it is judged that it is possible to use the semiconductor memory as a 192 KB-memory by setting the 64 KB-block as a non-use memory block. In this case, identification information indicating addresses of the 64 KB-block is stored in the relief condition storing unit 13.

Figure 3:
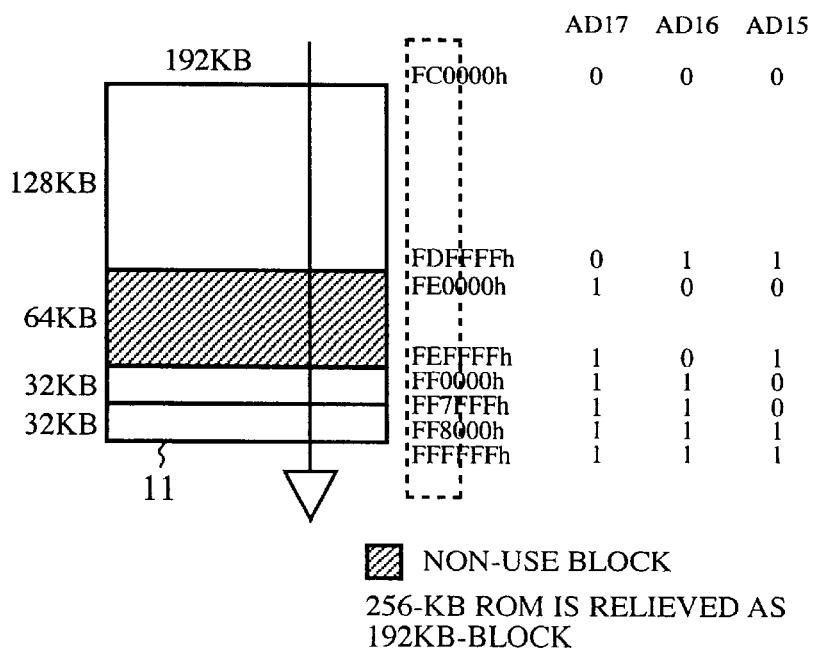
FIG. 3 is an explanatory view showing an example of identification information stored in a relief condition storing unit.

FIG. 3 is an explanatory view showing an example of identification information stored in the relief condition storing unit 13.

In the semiconductor memory having the memory capacity of 256K bytes, as an example, addresses FC0000h to FDFFFFh are assigned to the 128 KB-block, addresses FE0000h to FEFFFFh are assigned to the 64 KB-block, addresses FF0000h to FF7FFFh are assigned to the first 64 KB-block, and addresses FF8000h to FFFFFFh are assigned to the second 64 KB-block. In this address assignment, the 17-th address bit of a bit string indicating each address is expressed by AD17, the 16-th address bit of the bit string is expressed by AD16, and the 15-th address bit of the bit string is expressed by AD15. In this case, the 17-th address bit AD17 is set to "0" in the addresses of the 126 KB-block, the 17-th address bit AD17 is set to "1" in the addresses of both the 64 KB-block and the 32 KB-blocks, the 16-th address bit AD16 is set to "0" in the addresses of the 64 KB-block, the 16-th address bit AD16 is set to "1" in the addresses of the 32 KB-blocks, the 15-th address bit AD15 is set to "0" in the addresses of the first 32 KB-block, and the 15-th address bit AD15 is set to "1" in the addresses of the second 32 KB-block. Therefore, in cases where a value I1 corresponding to the 17-th address bit AD17, a value I2 corresponding to the 16-th address bit AD16 and a value I3 corresponding to the 15-th address bit AD15 are stored in the relief condition storing unit 13 as identification information, a defective memory block set as a non-use memory block can be specified.

For example, in cases where the value I1 of the identification information corresponding to the 17-th address bit AD17 is set to "0", the identification information indicates that the 126 KB-block is a defective memory block. In cases where the value I1 is set to "1" and the value I2 of the identification information corresponding to the 16-th address bit AD16 is set to "0", the identification information indicates that the 64 KB-block is a defective memory block. In cases where the value I1 set to "1", the value I2 set to "1" and the value I3 set to "0" are stored in the relief condition storing unit 13, the identification information indicates that the first 32 KB-block is a defective memory block. In cases where the value I1 set to "1", the value I2 set to "1" and the value I3 set to "1" are stored in the relief condition storing unit 13, the identification information indicates that the second 32 KB-block is a defective memory block.

Therefore, in case of the semiconductor memory having the memory capacity of 256 KB, the relief condition storing unit 13 can be formed of a memory unit in which identification information having at least 3 bits is stored. Here, a defective memory block set as a non-use memory block can be recognized according to a software process by reading out the identification information from the relief condition storing unit 13 to a central processing unit (CPU) not shown through the data bus.

Figure 4:
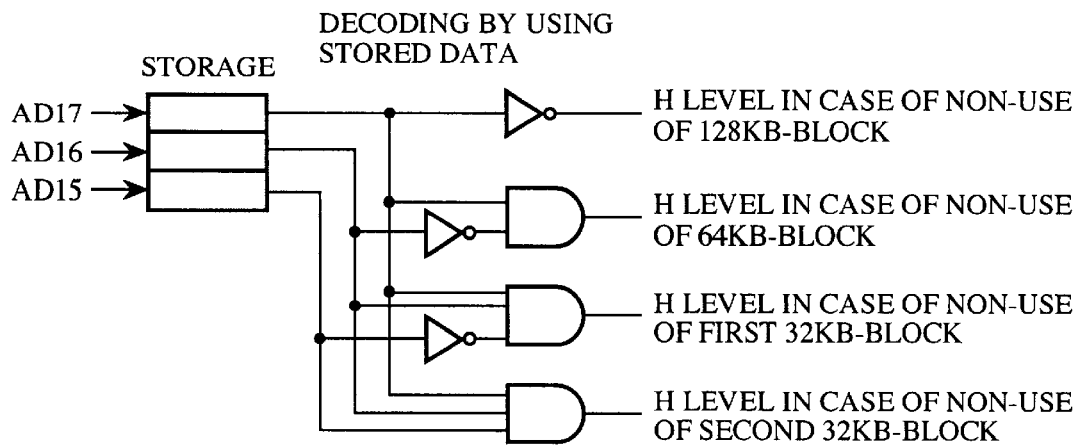
FIG. 4 is a circuit view of a decoding circuit arranged in an address control circuit.

Also, a defective memory block set as a non-use memory block can be recognized by combining a hardware unit with the relief condition storing unit 13. A decoding circuit shown in FIG. 4 is used as the hardware unit. In the decoding circuit, the identification information stored in the relief condition storing unit 13 is decoded, and a flag indicating a defective memory block set as a non-use memory block is produced. A memory block indicated by a flag set to the high (H) level denotes a defective memory block set as a non-use memory block.

Thereafter, upper address bits of an address sent to the address bus are received in the address control circuit 14, and lower address bits of the address sent to the address bus are received in the address control circuit 15. In cases where no identification information is stored in the relief condition storing unit 13, the upper and lower addresses are output from the address control circuits 14 and 15 to the Y decoder 16 and the X decoder 17 respectively without changing any values of the upper or lower address bits (refer to FIG. 5). In contrast, in cases where identification information is stored in the relief condition storing unit 13, values of the upper address bits are changed in the address control circuit 14 while referring to the identification information, and changed values of the upper address bits are output to the Y decoder 16 (refer to FIG. 5). The lower address bits are output to the X decoder 17 without changing any values of the lower address bits. Thereafter, data of a memory cell specified by the changed values of the upper address bits and the lower address bits is read out or written from/in the memory cell array 11 or the spare cell array 12.

For example, in a prior art, in cases where a group of physical addresses of a defective memory block is placed between a group of physical addresses of a non-defective memory block and a group of physical addresses of another non-defective memory block, because physical addresses of all non-defective memory blocks are not consecutive numbers, it is difficult to examine functions of memory cells of the non-defective memory blocks in a test suitable to the memory capacity of the non-defective memory blocks by inputting addresses not consecutive numbers to the address bus. However, in the first embodiment, in cases where the address change is performed in the address control circuit 14 so as to make consecutive addresses input to the address bus correspond to non-consecutive physical addresses of the non-defective memory blocks, it is easy to examine functions of memory cells of the non-defective memory blocks in a test suitable to the memory capacity of the non-defective memory blocks.

Figure 5:
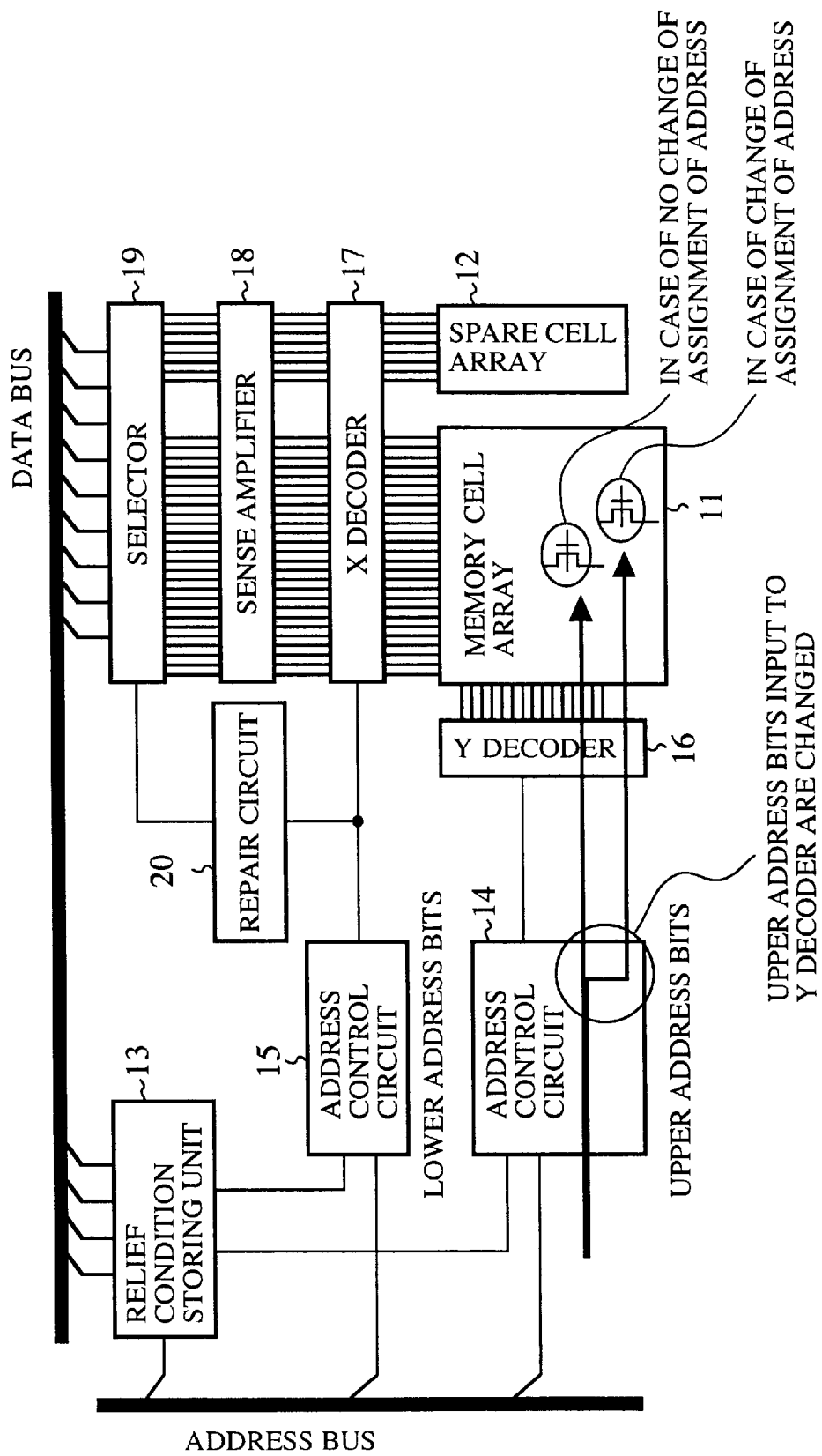
FIG. 5 is an explanatory view showing an address changing process.

In the semiconductor memory shown in FIG. 5, the decoding circuit shown in FIG. 4 is arranged in the address control circuit 14.

The change of values of the upper address bits performed in the address control circuit 14 is described in detail in an eighth embodiment.

As is described above, in the first embodiment, when the upper and lower address bits of the address sent to the address bus are received, the address change is performed according to the identification information identifying a defective memory block so as to easily specify physical addresses of non-defective memory blocks other than the defective memory block in a test suitable for a memory capacity of the non-defective memory blocks. Therefore, the memory capacity of the semiconductor memory is changed by setting the defective memory block as a non-use memory block. Accordingly, even though the number of main bit lines corresponding to defective memory cells exceeds the number of spare bit lines prepared in advance, the semiconductor memory can be relieved, and the yield of the semiconductor memory can be heightened.

Embodiment 2

In the first embodiment, identification information indicating a defective memory block set as a non-use memory block is stored in the relief condition storing unit 13. However, in a second embodiment, in addition to the identification information, information (or a usable memory capacity) indicating a usable memory capacity of the semiconductor memory lessened to relieve the semiconductor memory is stored in the relief condition storing unit 13. Therefore, information indicating a usable memory capacity of the semiconductor memory is read out from the relief condition storing unit 13 in a second test process performed after the first test process, and a test process corresponding to the usable memory capacity of the semiconductor memory can be performed.

For example, in cases where it is determined in the first test process that a 256 KB-ROM is used as a 128 KB-ROM to relieve the ROM, information indicating that a usable memory capacity of a ROM is set to 128 KB to relieve the ROM is stored in the relief condition storing unit 13. Thereafter, the information is read out from the relief condition storing unit 13 before the second test process, and a test program is executed in the second test process to test the ROM used as a 128 KB-ROM.

Here, a program having a branch condition is used as the test program to determine an address of an access according to the branch operation based on the information.

Embodiment 3

Figure 6:
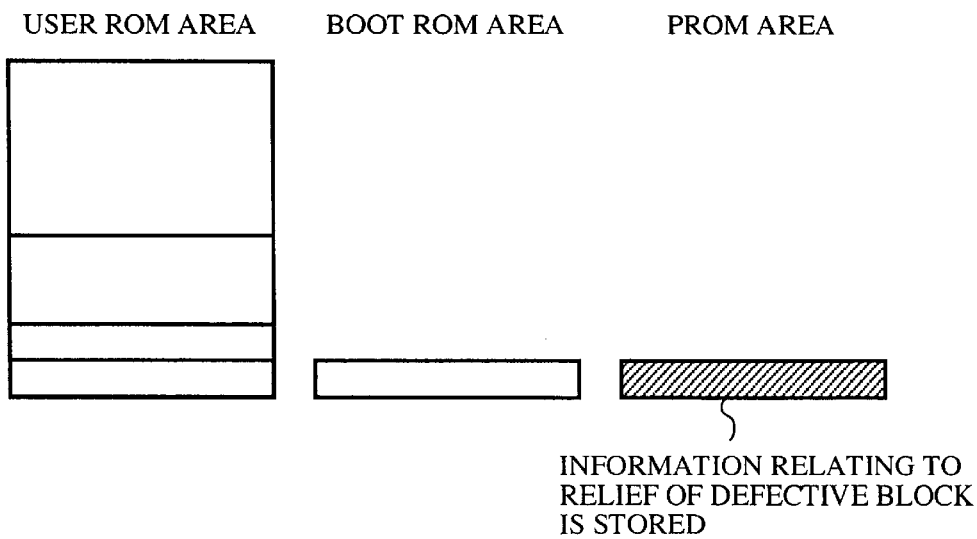
FIG. 6 is an explanatory view showing an arranging area of a relief condition storing unit.

In a third embodiment, as shown in FIG. 6, the relief condition storing unit 13 is arranged in a portion of a programmable read-only memory (PROM) area.

The PROM is used to store instruction codes of a pico-processor, and the writing and deleting of data to/from a flash memory is controlled by the pico-processor. The instruction codes are written in the PROM in a specific process, and it is generally inhibited that a user writes data in the PROM. Therefore, in cases where the relief condition storing unit 13 is arranged in the PROM, the semiconductor memory according to any of the first and second embodiments can be obtained without influencing on a user ROM.

Embodiment 4

Figure 7:
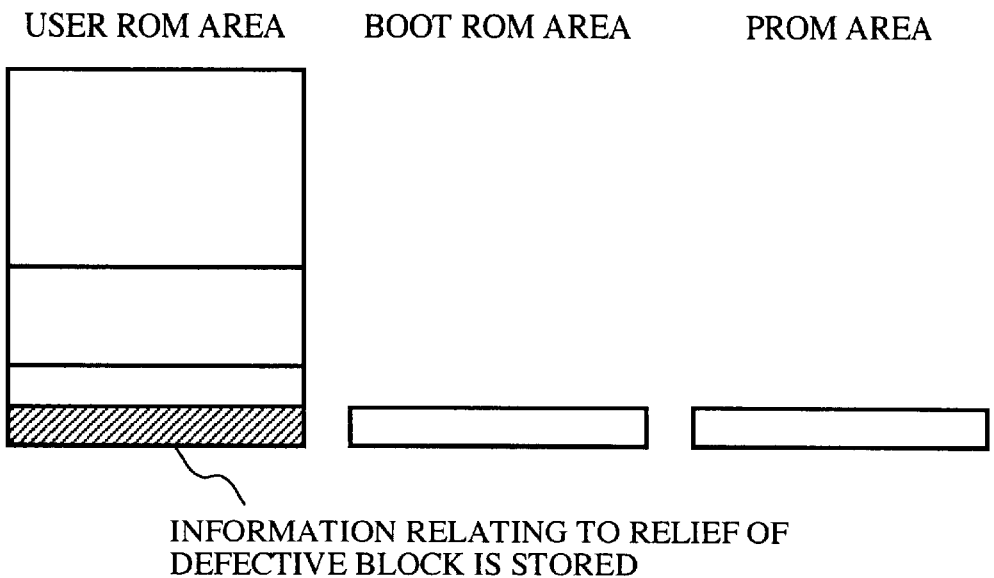
FIG. 7 is an explanatory view showing an arranging area of the relief condition storing unit.

In a fourth embodiment, as shown in FIG. 7, the relief condition storing unit 13 is arranged in a portion of the user ROM area. The user ROM is used by a user, and data is written or deleted in/from the user ROM. A reservation area such as a reset vector area or a non-maskable interrupt (NMI) vector table is placed in the user ROM.

Because the relief condition storing unit 13 is arranged in the user ROM, a memory capacity of the user ROM usable by the user is reduced. However, because the writing of the identification information in the relief condition storing unit 13 is not performed in a specific process, the identification information can be easily written and deleted.

Therefore, in cases where the relief condition storing unit 13 is arranged in the user ROM, the semiconductor memory according to any of the first and second embodiments can be easily obtained.

Embodiment 5

Figure 8:
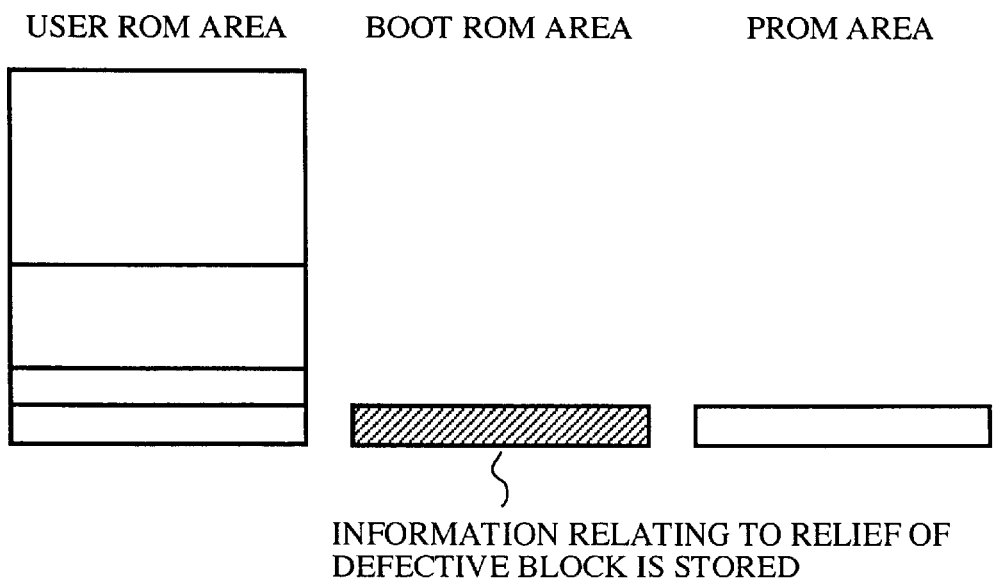
FIG. 8 is an explanatory view showing an arranging area of the relief condition storing unit.

In a fifth embodiment, as shown in FIG. 8, the relief condition storing unit 13 is arranged in a portion of a boot ROM area. It is normally impossible to write or delete data in/from the boot ROM according to a microcomputer mode. However, even a user can write and delete data in/from the boot ROM by using a flash writer, and a control program (or boot program) is stored in the boot ROM to be used for the onboard writing.

Therefore, in cases where the relief condition storing unit 13 is arranged in the boot ROM, the semiconductor memory can be obtained in the same manner as in the first and second embodiments.

Embodiment 6

In a sixth embodiment, as shown in FIG. 9, a plurality of LT fuses corresponding to the memory blocks of the memory cell array 11 respectively are arranged in the relief condition storing unit 13, and the LT fuse corresponding to each defective memory block is cut.

In detail, a plurality of LT fuses corresponding to the memory blocks of the memory cell array 11 respectively are formed in advance in the relief condition storing unit 13. In cases where a defective memory block is detected in a test process, the LT fuse corresponding to the defective memory block is cut. Thereafter, fuse information obtained from the LT fuses including the cut fuse is decoded to obtain identification information which identifies the defective memory block and indicates a usable memory capacity of the semiconductor memory lessened to relieve the semiconductor memory.

Embodiment 7

In a seventh embodiment, as shown in FIG. 10, the identification information stored in the relief condition storing unit 13 is written on a chip of the semiconductor memory according to a laser marking process.

In detail, identification information stored in the relief condition storing unit 13 is visually written on a chip of the semiconductor memory according to a laser marking process. Therefore, a lessened memory capacity of the semiconductor memory can be easily recognized by an operator with his eyes or according to the image recognition, and a test process suitable for the lessened memory capacity can be reliably performed for the semiconductor memory.

In cases where a large number of semiconductor memories are tested, the lessened memory capacity written on a chip of each semiconductor memory is read out by using a charge coupled device (CCD) camera to detect the lessened memory capacity in a test circuit, a test program corresponding to the lessened memory capacity is automatically selected according to a branch operation, and the semiconductor memories are tested one after another.

Accordingly, because the identification information is additionally written so as to be visually recognized, an operator managing a test flow can easily and reliably test a large number of semiconductor memories.

Embodiment 8

In the first embodiment, values of the upper address bits sent from the address bus to the address control circuit 14 are changed according to the identification information of the relief condition storing unit 13. In an eighth embodiment, this address change is described in detail. A physical address expressed by a set of address bits is assigned to each memory block of the semiconductor memory, and the address change is performed so as to make an address, which is expressed by a set of address bits respectively set to "0" and is input to the address bus, correspond to a physical address of a defective memory block of the semiconductor memory.

As shown in FIG. 11 as an example, the memory cell array 11 of a 256 KB-ROM has four 64 KB-blocks BLOCK1 to BLOCK 4. In this case, each memory block can be identified by a set of the 16-th and 17-th address bits AD16 and AD17. The memory block BLOCK1 is indicated by a set of bit values set to (AD16, AD17)=(0, 0), the memory block BLOCK2 is indicated by a set of bit values set to (AD16, AD17)=(1, 0), the memory block BLOCK3 is indicated by a set of bit values set to (AD16, AD17)=(0, 1), and the memory block BLOCK4 is indicated by a set of bit values set to (AD16, AD17)=(1, 1). Therefore, a defective memory block can be identified by the identification information which is expressed by a set of values I1 and I2 corresponding to the 17-th and 16-th address bits AD17 and AD16 respectively.

In cases where a set of values (I1, I2) corresponding to the set of bits (AD17, AD16) is sent as identification information from the relief condition storing unit 13 to the address control circuit 14, the identification information indicates that the memory block of a physical address expressed by the set of address bits (AD17, AD16) set to the values (I1, I2) is a defective memory block. Therefore, to make an address, which is expressed by a set of address bits (AD17, AD16) respectively set to "0" and is input to the address bus, correspond to the physical address of the defective memory block, in cases where the value I1 (or I2) is not equal to "0", a value of the address bit AD17 (or AD16) is inverted when the set of address bits (AD17, AD16) of the upper address bits are sent from the address bus to the address control circuit 14. That is to say, the defective memory block is compulsorily set to a bottom block which is indicated by the address bits AD17 and AD16 set to "0" together, and the physical address of the defective memory block agrees with a changed address obtained by inputting an address, which is expressed by a set of address bits (AD17, AD16) respectively set to "0", to the address bus.

In the example shown in FIG. 11, the memory block BLOCK2 indicated by address bit values (AD17, AD16)=(0, 1) is a defective memory block, and the identification information (I1, I2)=(0, 1) is received in the address control circuit 14. Because the value I2 of the identification information is not equal to "0", when the set of address bits (AD17, AD16) of the upper address bits are sent from the address bus to the address control circuit 14, the 16-th address bit AD16 corresponding to the value I2 is inverted in the address control circuit 14. In this case, the defective memory block BLOCK2 of the physical address (AD17, AD16)=(0, 1) is specified by inputting the address (AD17, AD16)=(0, 0) to the address bus, the memory block BLOCK1 of the physical address (AD17, AD16)=(0, 0) is specified by inputting the address (AD17, AD16)=(0, 1) to the address bus, the memory block BLOCK3 of the physical address (AD17, AD16)=(1, 0) is specified by inputting the address (AD17, AD16)=(1, 1) to the address bus, and the memory block BLOCK4 of the physical address (AD17, AD16)=(1, 1) is specified by inputting the address (AD17, AD16)=(1, 0) to the address bus.

In cases where the memory blocks BLOCK1 to BLOCK4 are rearranged in the order of increasing the address input to the address bus, the non-defective memory blocks BLOCK1, BLOCK3 and BLOCK4 are renamed as BLOCK2 to BLOCK4, and the non-defective memory blocks can be indicated by consecutive addresses.

Because the defective memory block is indicated by the address (AD17, AD16)=(0, 0) and the non-defective memory blocks are indicated by consecutive addresses, a test suitable for the memory capacity of 192K bytes can be easily performed for the 256 KB-ROM. Also, it is not required to guarantee a memory block indicated by the address (AD17, AD16)=(0, 0). Therefore, the 256 KB-ROM can be used as a 192 KB-ROM by setting the memory block indicated by the address bit values (AD17, AD16)=(0, 0) as a non-use memory block. Accordingly, in cases where the second test process corresponding to a 192 KB-ROM is performed for the upper memory area of the 256 KB-ROM by reading out information indicating a usable memory capacity of the 256 KB-ROM from the relief condition storing unit 13, the 256 KB-ROM can be relieved as a 192 KB-ROM, and the defective 256 KB-ROM can be used as a non-defective 192 KB-ROM.

In the example shown in FIG. 12, the memory block BLOCK3 indicated by address bit values (AD17, AD16)=(1, 0) is a defective memory block, and the identification information (I1, I2)=(1, 0) is received in the address control circuit 14. Because the value I1 of the identification information is not equal to "0", when the set of address bits (AD17, AD16) of the upper address bits are sent from the address bus to the address control circuit 14, the 17-th address bit AD17 corresponding to the value I1 is inverted in the address control circuit 14. In this case, the defective memory block BLOCK3 of the physical address (AD17, AD16)=(1, 0) is specified by inputting the address (AD17, AD16)=(0, 0) to the address bus, the memory block BLOCK1 of the physical address (AD17, AD16)=(0, 0) is specified by inputting the address (AD17, AD16)=(1, 0) to the address bus, the memory block BLOCK2 of the physical address (AD17, AD16)=(0, 1) is specified by inputting the address (AD17, AD16)=(1, 1) to the address bus, and the memory block BLOCK4 of the physical address (AD17, AD16)=(1, 1) is specified by inputting the address (AD17, AD16)=(0, 1) to the address bus.

In cases where the memory blocks BLOCK1 to BLOCK4 are rearranged in the order of increasing the address input to the address bus, the non-defective memory blocks BLOCK1, BLOCK2 and BLOCK4 are renamed as BLOCK2 to BLOCK4, and the non-defective memory blocks can be indicated by consecutive addresses.

In the example shown in FIG. 13, the memory block BLOCK4 indicated by address bit values (AD17, AD16)=(1, 1) is a defective memory block, and the identification information (I1, I2)=(1, 1) is received in the address control circuit 14. Because the values I1 and I2 of the identification information differ from "0", when the set of address bits (AD17, AD16) of the upper address bits are sent from the address bus to the address control circuit 14, the 17-th address bit AD17 and the 16-th address bit AD16 corresponding to the values I1 and I2 are inverted in the address control circuit 14. In this case, the defective memory block BLOCK4 of the physical address (AD17, AD16)=(1, 1) is specified by inputting the address (AD17, AD16)=(0, 0) to the address bus, the memory block BLOCK1 of the physical address (AD17, AD16)=(0, 0) is specified by inputting the address (AD17, AD16)=(1, 1) to the address bus, the memory block BLOCK2 of the physical address (AD17, AD16)=(0, 1) is specified by inputting the address (AD17, AD16)=(1, 0) to the address bus, and the memory block BLOCK3 of the physical address (AD17, AD16)=(1, 0) is specified by inputting the address (AD17, AD16)=(0, 1) to the address bus.

In cases where the memory blocks BLOCK1 to BLOCK4 are rearranged in the order of increasing the address input to the address bus, the non-defective memory blocks BLOCK1, BLOCK2 and BLOCK3 are renamed as BLOCK2 to BLOCK4, and the non-defective memory blocks can be indicated by consecutive addresses.

Also, in cases where the memory block BLOCK1 indicated by address bit values (AD17, AD16)=(0, 0) is a defective memory block among the memory blocks BLOCK1 to BLOCK4, no identification information is stored in the relief condition storing unit 13, and no address bit AD16 or AD17 included in the upper address bits is inverted.

Here, the address change is performed in an XOR circuit (or a logic circuit) of the address control circuit 14.

Figure 14:
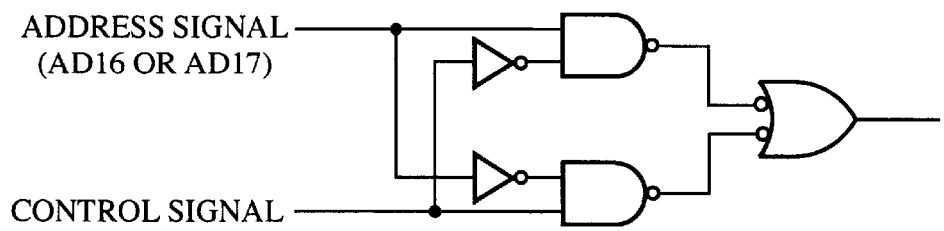
FIG. 14 is a circuit view showing an exclusive logical sum (XOR) circuit of the address control circuit.

FIG. 14 is a circuit view showing an exclusive logical sum (XOR) circuit of the address control circuit 14. In FIG. 14, two input signals are input to the XOR circuit, and one output signal is output from the XOR circuit. In cases where the input signals are set to the "L" level together, the output signal set to the "L" level is output. In case where one input signal is set to the "L" level and the other input signal is set to the "H" level, the output signal set to the "H" level is output. In cases where the input signals are set to the "H" level together, the output signal set to the "L" level is output.

In this embodiment, the XOR circuit corresponding to the 16-th address bit AD16 and the XOR circuit corresponding to the 17-th address bit AD17 are arranged in the address control circuit 14. When an address signal indicating the value of the address bit AD16 or AD17 and a control signal are received in each XOR circuit as two input signals, an address signal indicating the address bit AD16 or AD17 inverted or not inverted is output as one output signal.

Therefore, in cases where no defective memory block exists in the semiconductor memory such as a ROM or the memory block BLOCK1 indicated by the address bit values (AD17, AD16)=(0, 0) denoting a bottom block is a defective memory block, because it is not required to invert any address bit AD16 or AD17, the control signal set to the "L" level is input as one of the input signals in each XOR circuit. In this case, because the level of the output signal is the same as that of the address signal indicating the value of the address bit AD16 or AD17, the address bit AD16 or AD17 is not inverted.

In contrast, in cases where the memory block BLOCK2, BLOCK3 or BLOCK4 indicated by the address bit values (AD17, AD16)=(0, 1), (1, 0) or (1, 1) is a defective memory block, it is required to invert at least one of the address bits AD16 and AD17. Therefore, in cases where it is recognized in the test process that the memory block BLOCK2 indicated by the address bit values (AD17, AD16)=(0, 1) is a defective memory block, the control signal set to the "H" level is input with the address signal indicating the value of the 16-th address bit AD16 in the XOR circuit corresponding to the 16-th address bit AD16, and the control signal set to the "L" level is input with the address signal indicating the value of the 17-th address bit AD17 in the XOR circuit corresponding to the 17-th address bit AD17. In this case, in the XOR circuit corresponding to the 16-th address bit AD16, because the level of the output signal is opposite to that of the address signal indicating the value of the 16-th address bit AD16, the 16-th address bit AD16 is inverted. Also, in the XOR circuit corresponding to the 17-th address bit AD17, because the level of the output signal is the same as that of the address signal indicating the value of the 17-th address bit AD17, the 17-th address bit AD17 is not inverted.

Also, in cases where it is recognized in the test process that the memory block BLOCK3 indicated by the address bit values (AD17, AD16)=(1, 0) is a defective memory block, the control signal set to the "L" level is input with the address signal indicating the value of the 16-th address bit AD16 in the XOR circuit corresponding to the 16-th address bit AD16, and the control signal set to the "H" level is input with the address signal indicating the value of the 17-th address bit AD17 in the XOR circuit corresponding to the 17-th address bit AD17. Therefore, the 16-th address bit AD16 is not inverted, but the 17-th address bit AD17 is inverted.

Also, in cases where it is recognized in the test process that the memory block BLOCK4 indicated by the address bit values (AD17, AD16)=(1, 1) is a defective memory block, the control signal set to the "H" level is input with the address signal indicating the value of the 16-th address bit AD16 in the XOR circuit corresponding to the 16-th address bit AD16, and the control signal set to the "H" level is input with the address signal indicating the value of the 17-th address bit AD17 in the XOR circuit corresponding to the 17-th address bit AD17. Therefore, the 16-th address bit AD16 and the 17-th address bit AD17 are inverted together.

Figure 15:
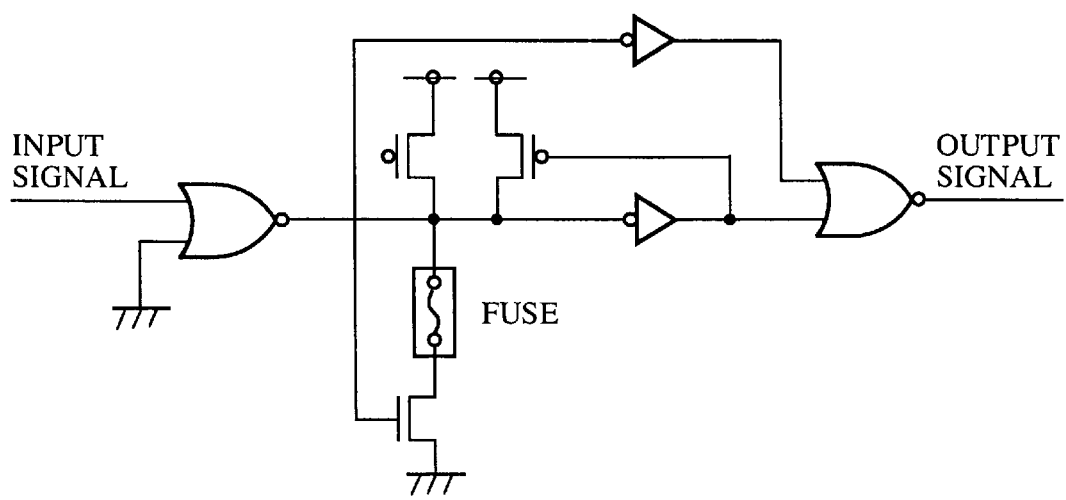
FIG. 15 is a circuit view showing a control signal producing circuit.

FIG. 15 is a circuit view showing a control signal producing circuit for producing the control signal input to the XOR circuit of the address control circuit 14.

In FIG. 15, in cases where a fuse is not cut in a control signal producing circuit, an output signal denoting the control signal is always set to the "L" level regardless of the level of an input signal. In contrast, in cases where the fuse is cut, the level of the output signal is always the same as that of the input signal. In this embodiment, the control signal producing circuit corresponding to the 16-th address bit AD16 and the control signal producing circuit corresponding to the 17-th address bit AD17 are arranged in the address control circuit 14.

Therefore, in cases where no defective memory block exists in the semiconductor memory such as a ROM or the memory block BLOCK1 indicated by the address bit values (AD17, AD16)=(0, 0) denoting a bottom block is a defective memory block, because it is not required to invert any address bit AD16 or AD17, the control signal producing circuits corresponding to the 16-th address bit AD16 and the 17-th address bit AD17 are arranged in the address control circuit 14 without cutting the fuse. In this case, because the output signal is always set to the "L" level, it is appropriate that the output signal is input to each XOR circuit as the control signal.

In contrast, in cases where the memory block BLOCK2, BLOCK3 or BLOCK4 indicated by the address bit values (AD17, AD16)=(0, 1), (1, 0) or (1, 1) is a defective memory block, it is required to invert at least one of the address bits AD16 and AD17. Therefore, in cases where it is recognized in the test process that the memory block BLOCK2 indicated by the address bit values (AD17, AD16)=(0, 1) is a defective memory block, the fuse is cut in the control signal producing circuit corresponding to the 16-th address bit AD16, and the fuse is not cut in the control signal producing circuit corresponding to the 17-th address bit AD17, and a signal, of which the level is set to the "H" level in response to the access to any address of the ROM, is used as the input signal. In this case, the output signal is set to the "H" level in the control signal producing circuit corresponding to the 16-th address bit AD16 when the ROM is operated, and the output signal is always set to the "L" level in the control signal producing circuit corresponding to the 17-th address bit AD17. Here, a pre-decode signal (CSROM signal) is, for example, used as the signal set to the "H" level in response to the access to the ROM address.

Also, in cases where it is recognized in the test process that the memory block BLOCK3 indicated by the address bit values (AD17, AD16)=(1, 0) is a defective memory block, the fuse is not cut in the control signal producing circuit corresponding to the 16-th address bit AD16, but the fuse is cut in the control signal producing circuit corresponding to the 17-th address bit AD17. In this case, the output signal is set to the "H" level in the control signal producing circuit corresponding to the 17-th address bit AD17 when the ROM is operated, and the output signal is always set to the "L" level in the control signal producing circuit corresponding to the 16-th address bit AD16.

Also, in cases where it is recognized in the test process that the memory block BLOCK4 indicated by the address bit values (AD17, AD16)=(1, 1) is a defective memory block, the fuses are cut in the control signal producing circuits corresponding to the 16-th address bit AD16 and the 17-th address bit AD17. In this case, the output signal is set to the "H" level in each of the control signal producing circuits corresponding to the 16-th address bit AD16 and the 17-th address bit AD17 when the ROM is operated.

Therefore, it is appropriate that the output signal is input to each XOR circuit as the control signal.

Figure 16:
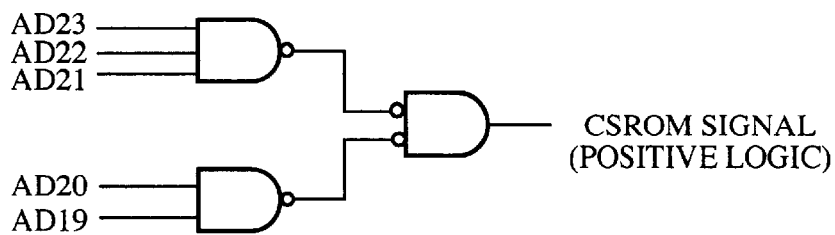
FIG. 16 is a circuit view showing a CSROM signal producing circuit.

FIG. 16 is a circuit view showing a CSROM signal producing circuit for producing the CSROM signal.

In FIG. 16, a CSROM signal producing circuit is, for example, arranged in a microcomputer in which a 512 KB-ROM is arranged. In cases where signals of all address bits AD19 to AD23 are set to the "H" level together, an output signal denoting the CSROM signal is set to the "H" level.

Addresses F80000h to FFFFFFh are allocated to memory cells of the 512 KB-ROM. Therefore, in cases where all the address bits AD19 to AD23 are set to the "H" level together, the access to the ROM is performed. Therefore, the CSROM signal set to the "H" level is input to each control signal producing circuit in response to the access to the ROM address.

Embodiment 9

In the eighth embodiment, the address control circuit 14 is formed of hardware elements. However, in a ninth embodiment, the address control circuit 14 is formed of a software tool. That is to say, the change of address assignment for the memory cell array 11 is performed in an assembler and compiler (or an address changing means) used as the address control circuit 14 to relieve a semiconductor memory.

In detail, when it is desired to store a user program in the semiconductor memory shown in FIG. 2, the assembler and compiler is operated for the user program, and the user program compiled and assembled is stored in the semiconductor memory. In this case, identification information stored in the relief condition storing unit 13 is read out to the assembler and compiler, and the user program is compiled and assembled in the assembler and compiler to be stored in memory blocks other than a defective memory block.

Figure 17:
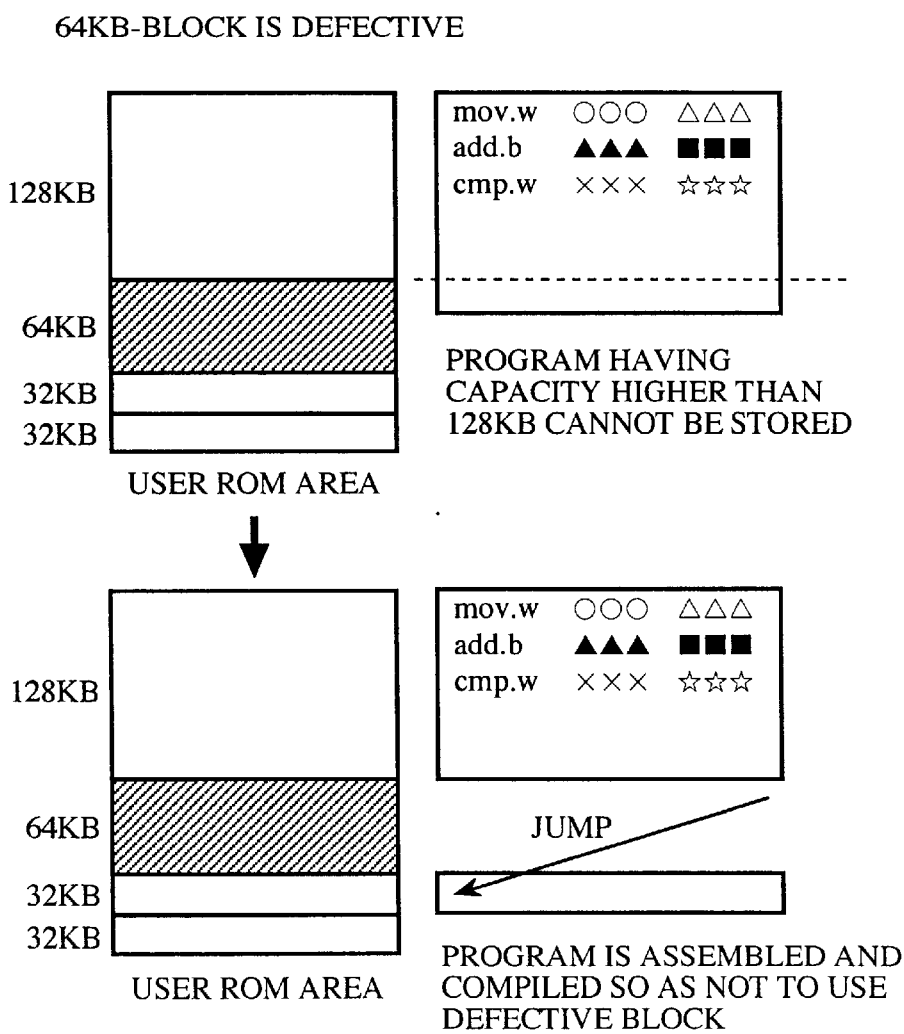
FIG. 17 is a view showing the conception of setting a defective memory block as a non-use memory block in a assembler and compiler.
Figure 18:
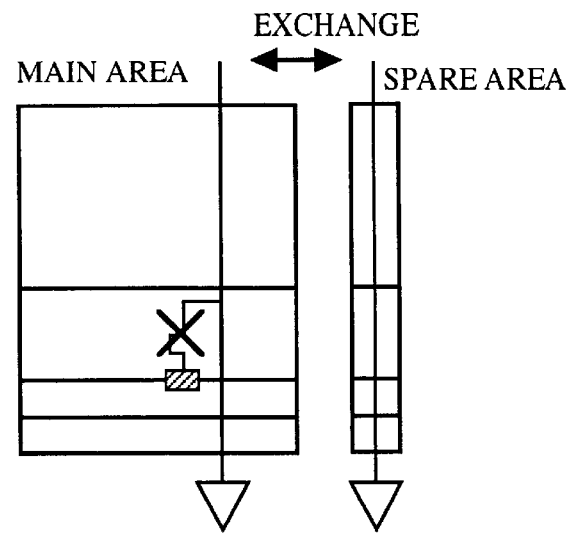
FIG. 18 is a view showing a conventional conception of the relief of a defective flash memory.
Figure 19:
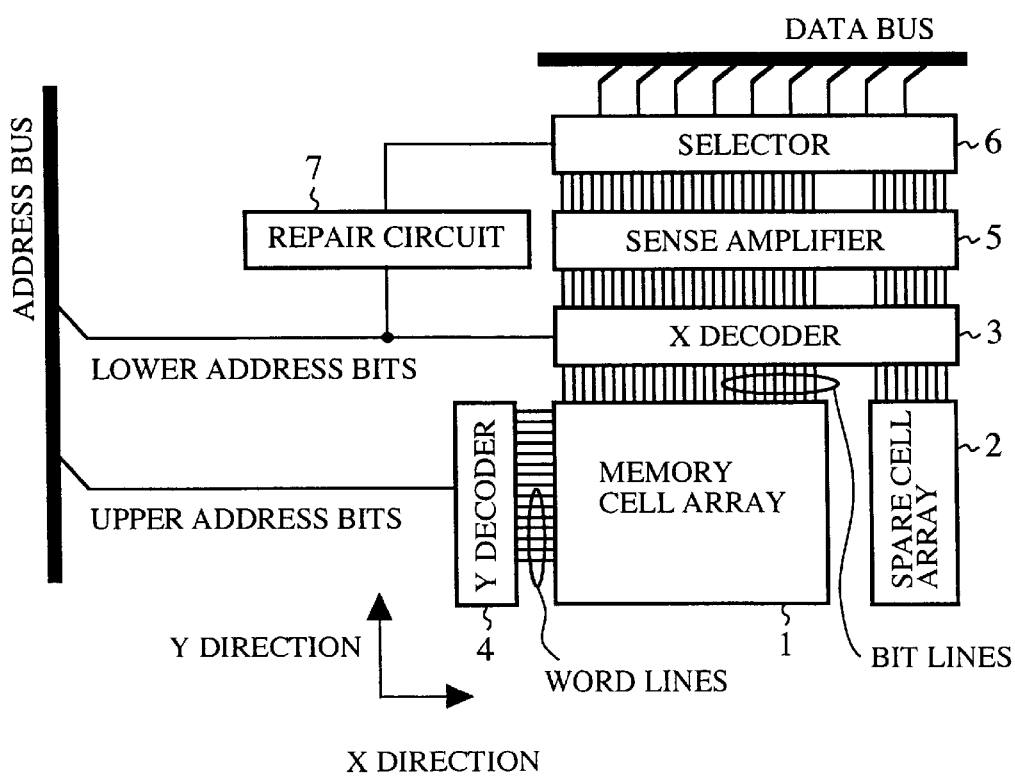
FIG. 19 is a view showing the configuration of a conventional semiconductor memory.
Figure 20:
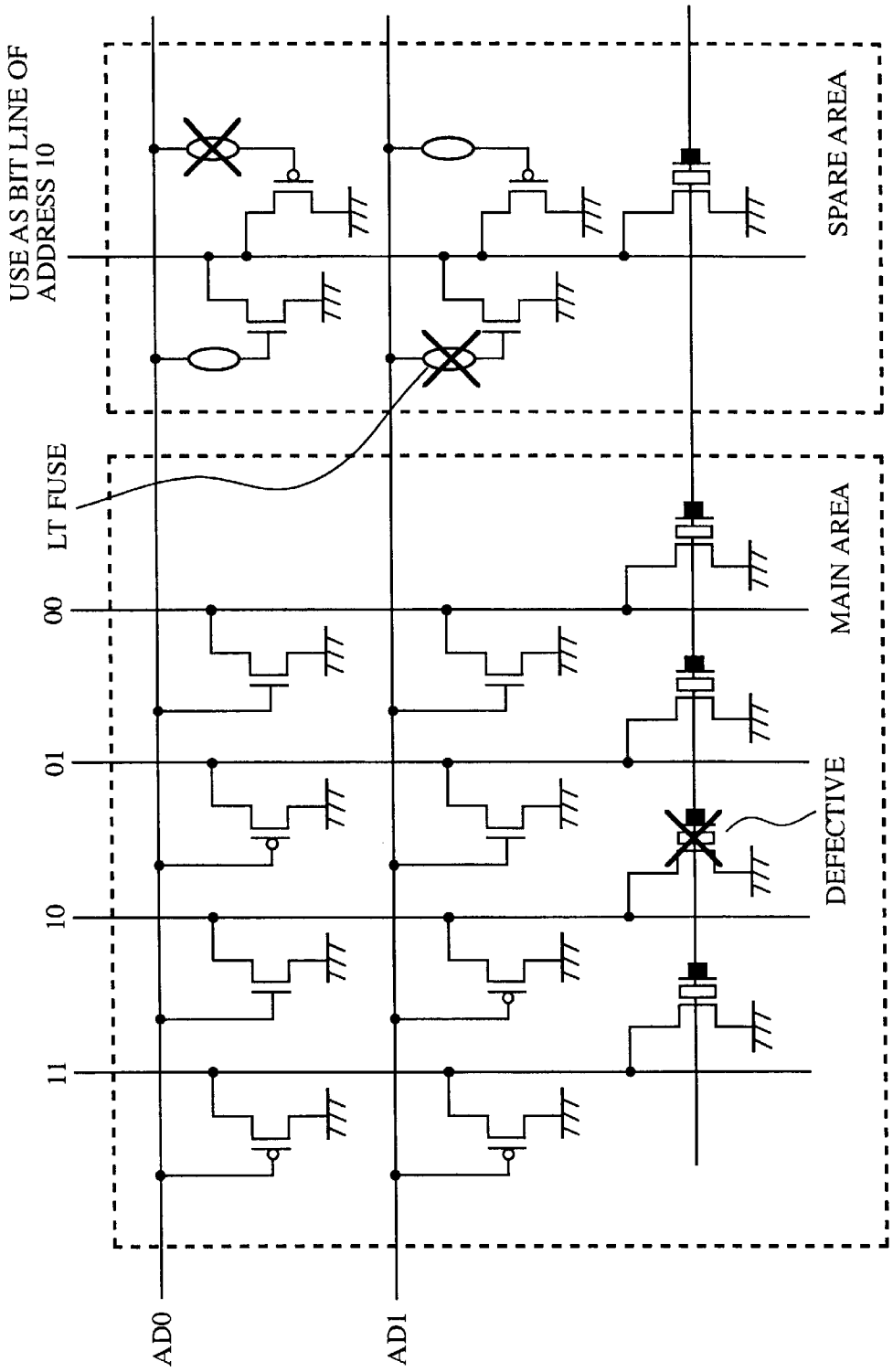
FIG. 20 is a view showing the configuration of an address replacing circuit.
Figure 21:
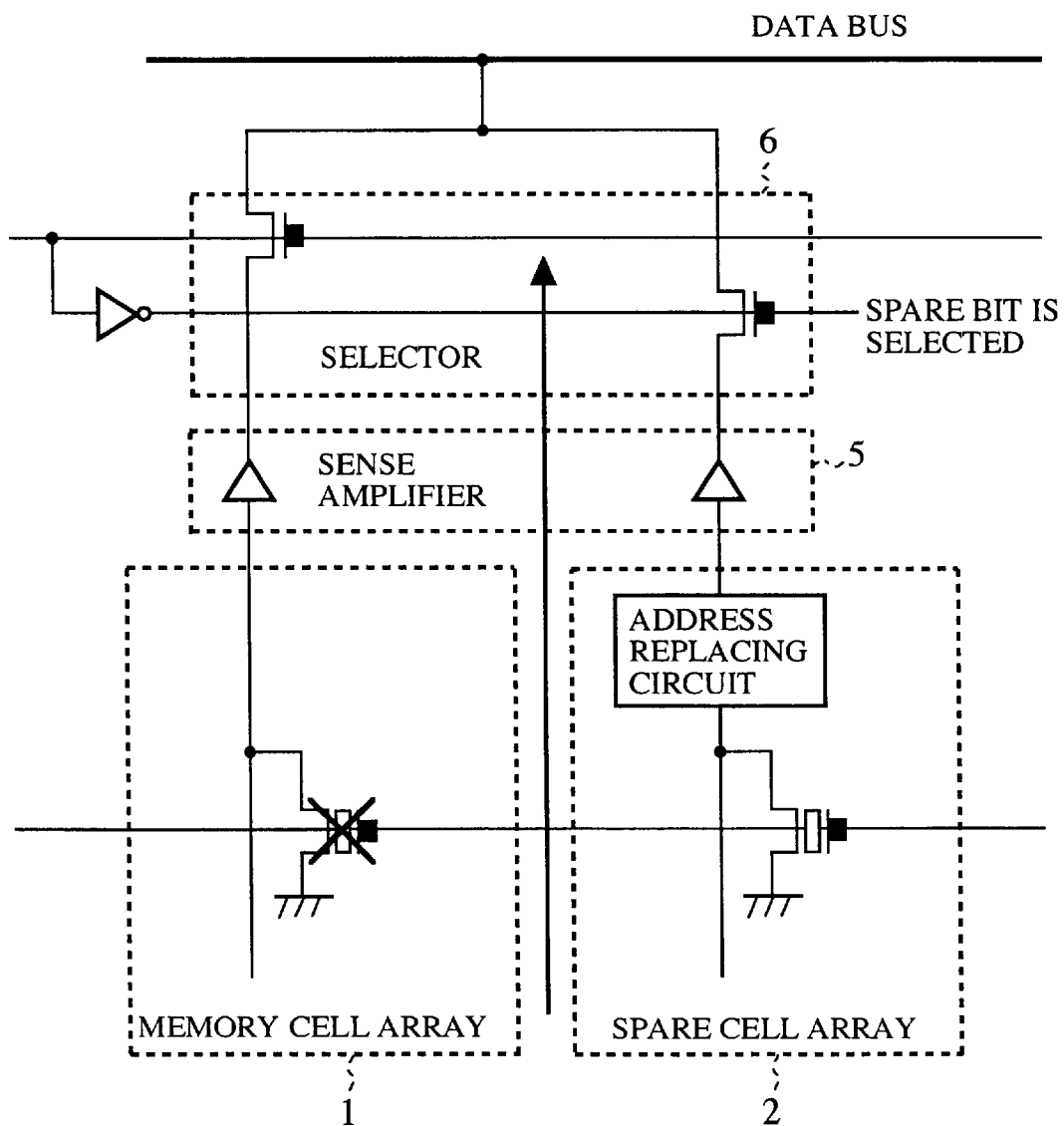
FIG. 21 is an explanatory view showing a function of the selector shown in FIG. 19.

FIG. 17 is a view showing the conception of setting a defective memory block as a non-use memory block in the assembler and compiler.

For example, the memory cell array 11 of a 256 KB-ROM representing the semiconductor memory has a 128 KB-block BLOCK1, a 64 KB-block BLOCK2, a first 32 KB-block BLOCK3 and a second 32 KB-block BLOCK 4, and the 64 KB-block BLOCK2 is defective. In cases where the user program compiled and assembled has a storage volume of 10K bytes, the user program can be stored in any of the memory blocks other than the defective memory block. However, in a prior art, in cases where the user program compiled and assembled has a storage volume higher than 128 KB, even though the 256 KB-ROM is relieved as a 192 KB-ROM, because the usable memory block BLOCK1 is separated from the usable memory blocks BLOCK3 and BLOCK 4, the user program cannot be stored in the 256 KB-ROM relieved as a 192 KB-ROM. To prevent this situation, the user program is compiled and assembled in the assembler and compiler to be stored in the usable memory blocks BLOCK1, BLOCK3 and BLOCK 4 other than the defective memory block. Therefore, the defective memory block BLOCK2 is set as a non-use memory block in the assembler and compiler.

For example, to set a defective memory block as a non-use memory block, it is judged in the assembler and compiler whether or not a memory capacity of usable memory blocks, to which physical addresses are consecutively assigned, is equal to or higher than a volume of the user program. In cases where the usable memory blocks having a memory capacity equal to or higher than a volume of the user program exists in the 256 KB-ROM, the user program is stored in the usable memory blocks under the control of the assembler and compiler. In contrast, in cases where the usable memory blocks having a memory capacity equal to or higher than a volume of the user program does not exist in the 256 KB-ROM, the user program is divided into a first divided user program and a second divided program so as to store the first divided user program in the usable memory blocks, the second divided program is stored in another usable memory block of which a block of physical addresses is not consecutive with the physical addresses of the usable memory blocks of the first divided user program, and a jump instruction is added to the user program in the assembler and compiler to connect the first divided user program and the second divided program in the software process.

What is claimed is:

1. A semiconductor memory comprising:

a memory cell array having a plurality of memory blocks;

identification information storing means for storing identification information which identifies a defective memory block existing in the memory blocks of the memory cell array; and address changing means for receiving an address from an address bus, changing the address to a changed address according to the identification information of the identification information storing means and outputting the changed address to a decoder of the memory cell array to specify a memory cell of the memory cell array according to the changed address.

2. A semiconductor memory according to claim 1, wherein a usable memory capacity of the memory cell array is stored in the identification information storing means.

3. A semiconductor memory according to claim 2, wherein the identification information storing means is arranged in an area of a programmable read-only memory.

4. A semiconductor memory according to claim 2, wherein the identification information storing means is arranged in an area of a user read-only memory.

5. A semiconductor memory according to claim 2, wherein the identification information storing means is arranged in an area of a boot read-only memory.

6. A semiconductor memory according to claim 1, wherein the identification information storing means has a fuse corresponding to each of the memory blocks of the memory cell array, and the fuse corresponding to the defective memory block is cut.

7. A semiconductor memory according to claim 1, wherein the identification information stored in the identification information storing means is written on a chip of the semiconductor memory according to laser marking.

8. A semiconductor memory according to claim 1, wherein the address changing means comprises a logic circuit for receiving both an address signal indicating a value of an address bit of the address and a control signal controlling the address change, calculating an exclusive logical sum of both the address signal and the control signal and outputting the exclusive logical sum as the value of an address bit of the changed address.

9. A semiconductor memory according to claim 8, wherein the address changing means comprises a control signal producing circuit having a fuse for outputting the control signal, which indicates no change of the address in case of a non-cut fuse, to the logic circuit and outputting the control signal, which indicates a change of the address in case of a cut fuse, to the logic circuit.

10. A semiconductor memory according to claim 1, wherein the address changing means comprises a software tool so as to connect a plurality of memory blocks of the memory cell array other than the defective memory block according to a software process.

11. A semiconductor memory according to claim 1, wherein the address change is performed by the address changing means so as to change a specific address assigned to a bottom memory block to a physical address of the defective memory block identified by the identification information.

* * * * *